US012610818B2

(12) United States Patent
Jeon et al.

(10) Patent No.: US 12,610,818 B2
(45) Date of Patent: Apr. 21, 2026

(54) SINGLE SWITCH DIRECT COOLING ASSEMBLIES AND RELATED METHODS

(71) Applicant: SEMICONDUCTOR COMPONENTS INDUSTRIES, LLC, Phoenix, AZ (US)

(72) Inventors: Oseob Jeon, Seoul (KR); Yoonsoo Lee, Incheon (KR); Bosung Won, Seoul (KR); Youngsun Ko, Incheon (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 516 days.

(21) Appl. No.: 18/165,504

(22) Filed: Feb. 7, 2023

(65) Prior Publication Data

US 2024/0266252 A1    Aug. 8, 2024

(51) Int. Cl.
| | |
|---|---|
| *H01L 23/473* | (2006.01) |
| *H01L 23/367* | (2006.01) |
| *H01L 23/49* | (2006.01) |
| *H05K 7/20* | (2006.01) |

(52) U.S. Cl.
CPC ........ *H01L 23/473* (2013.01); *H01L 23/3672* (2013.01); *H01L 23/49* (2013.01); *H05K 7/20509* (2013.01)

(58) Field of Classification Search
CPC ............. H01L 23/3107; H01L 23/3121; H01L 23/3672; H01L 23/473; H01L 23/49; H01L 25/0655; H01L 25/071; H01L 25/072; H01L 25/074; H01L 25/117;

H01L 25/18; H01L 21/4882; H05K 7/20145; H05K 7/20154; H05K 7/20254; H05K 7/20272; H05K 7/20327; H05K 7/20336; H05K 7/2039; H05K 7/20409; H05K 7/20418; H05K 7/20509; H05K 7/20927; H05K 7/20936; H05K 5/03; G06F 1/20; G06F 1/206
See application file for complete search history.

(56) References Cited

U.S. PATENT DOCUMENTS

| | | | |
|---|---|---|---|
| 7,177,153 B2 | 2/2007 | Radosevich et al. | |
| 7,710,723 B2 | 5/2010 | Korich et al. | |
| 11,011,452 B2 * | 5/2021 | Qu ........................ | H01L 23/367 |
| 11,849,569 B2 * | 12/2023 | Zhou .................. | H05K 7/20254 |
| 2006/0096299 A1 * | 5/2006 | Mamitsu ............ | H05K 7/20927 |
| | | | 257/E23.098 |
| 2008/0269340 A1 | 10/2008 | Koya et al. | |

(Continued)

FOREIGN PATENT DOCUMENTS

| | | |
|---|---|---|
| DE | 102005052756 A1 | 7/2006 |
| WO | 2019037904 A1 | 2/2019 |

*Primary Examiner* — Amir A Jalali
(74) *Attorney, Agent, or Firm* — IPTechLaw

(57) ABSTRACT

Implementations of a dual sided cooling module may include a high side module coupled over a low side module through a coupling heat sink at a first largest planar surface of the high side module and at a first largest planar surface of the low side module; a high side heat sink coupled at a second largest planar surface of the high side module; and a low side heat sink coupled at a second largest planar surface of the low side module. A single cooling fluid may contact the coupling heat sink, the high side heat sink, and the low side heat sink.

8 Claims, 19 Drawing Sheets

(56)         References Cited

U.S. PATENT DOCUMENTS

| 2010/0321889 | A1* | 12/2010 | Yoshino | H05K 7/20927 |
| | | | | 361/702 |
| 2011/0316143 | A1* | 12/2011 | Noritake | H01L 23/473 |
| | | | | 257/713 |
| 2014/0043765 | A1* | 2/2014 | Gohara | H01L 23/473 |
| | | | | 361/699 |
| 2016/0211741 | A1 | 7/2016 | Ishino et al. | |
| 2017/0040241 | A1* | 2/2017 | Yoshida | H01L 23/473 |
| 2017/0301662 | A1* | 10/2017 | Kimura | H01L 23/49548 |
| 2021/0337703 | A1* | 10/2021 | Lee | H01L 23/473 |
| 2023/0077598 | A1* | 3/2023 | Ewanchuk | H05K 7/209 |
| | | | | 363/141 |
| 2024/0064944 | A1* | 2/2024 | Paul | H05K 7/20927 |
| 2024/0107720 | A1* | 3/2024 | Rohl | H02M 1/32 |
| 2024/0114657 | A1* | 4/2024 | Helberg | H05K 7/2039 |
| 2024/0121913 | A1* | 4/2024 | Hsiung | H05K 7/2039 |
| 2024/0162117 | A1* | 5/2024 | Lee | H01L 23/3677 |
| 2024/0282663 | A1* | 8/2024 | Im | H01L 23/3107 |

* cited by examiner

52

54

56

58

60

68

64

66

62

72

70

138

140

SINGLE SWITCH DIRECT COOLING ASSEMBLIES AND RELATED METHODS

BACKGROUND

1. Technical Field

Aspects of this document relate generally to semiconductor packages, such as packages for semiconductor devices and associated circuitry. More specific implementations involve fluid cooled semiconductor packages.

2. Background

Semiconductor packages have been devised to provide mechanical support and electrical connections to a semiconductor die and associated components. Various package types may also assist with protection of the semiconductor die from humidity and other contaminants during operation.

SUMMARY

Implementations of a dual sided cooling module may include a high side module coupled over a low side module through a coupling heat sink at a first largest planar surface of the high side module and at a first largest planar surface of the low side module; a high side heat sink coupled at a second largest planar surface of the high side module; and a low side heat sink coupled at a second largest planar surface of the low side module. A single cooling fluid may contact the coupling heat sink, the high side heat sink, and the low side heat sink.

Implementations of a dual sided cooling module may include one, all, or any of the following:

The module may include electrical connectors extending from two ends of the high side module and from two ends of the low side module.

The high side module and the low side module include a single switch.

The coupling heat sink may be directly coupled with the first largest planar surface of the high side module and with the first largest planar surface of the low side module.

The coupling heat sink may include folded fins.

The coupling heat sink, the high side heat sink, and the low side heat sink all may include the same pin structure.

At least one of the coupling heat sink, the high side heat sink, and the low side heat sink may include a different pin structure.

An enclosure may enclose the high side module, the low side module, the high side heat sink, the low side heat sink, and the single cooling fluid.

Implementations of a single sided cooling module may include a high side module directly mechanically coupled over a low side module through a coupling heat sink at a first largest planar surface of the high side module and at a first largest planar surface of the low side module. The high side module and the low side module may be thermally coupled only through the coupling heat sink.

Implementations of a single sided cooling module may include one, all, or any of the following:

The module may include electrical connectors extending from two ends of the high side module and from two ends of the low side module.

The high side module and the low side module may include a single switch.

The coupling heat sink may include folded fins.

Implementations of a cooling assembly may include at least two single switch modules coupled into corresponding openings in a support frame; an upper jacket coupled to the support frame; a lower jacket coupled to the support frame; a coolant inlet coupled with the support frame; and a coolant outlet coupled with the support frame. Each of the at least two single switch modules may include a high side module directly mechanically coupled over a low side module through a coupling heat sink at a first largest planar surface of the high side module and at a first largest planar surface of the low side module.

Implementations of a cooling assembly may include, one, all, or any of the following:

The support frame may include at least two flow pathways therein configured to direct cooling fluid to the coupling heat sink of each of the at least two single switch modules.

The lower jacket and the upper jacket may be coupled over the at least two single switch modules.

The assembly may be an immersion cooling module.

The at least two single switch modules may be configured to be single side cooled by a coolant passing from the coolant inlet to the coolant outlet.

The at least two single switch modules may be configured to be dual side cooled by a coolant passing from the coolant inlet to the coolant outlet.

The high side module and the low side module may be thermally coupled only through the coupling heat sink.

The assembly may include: a high side heat sink coupled at a second largest planar surface of the high side module; and a low side heat sink coupled at a second largest planar surface of the low side module. A single cooling fluid may contact the coupling heat sink, the high side heat sink, and the low side heat sink.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended single switch direct cooling assemblies and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such single switch direct cooling assemblies and related methods, and implementing components and methods, consistent with the intended operation and methods.

Figure 1:
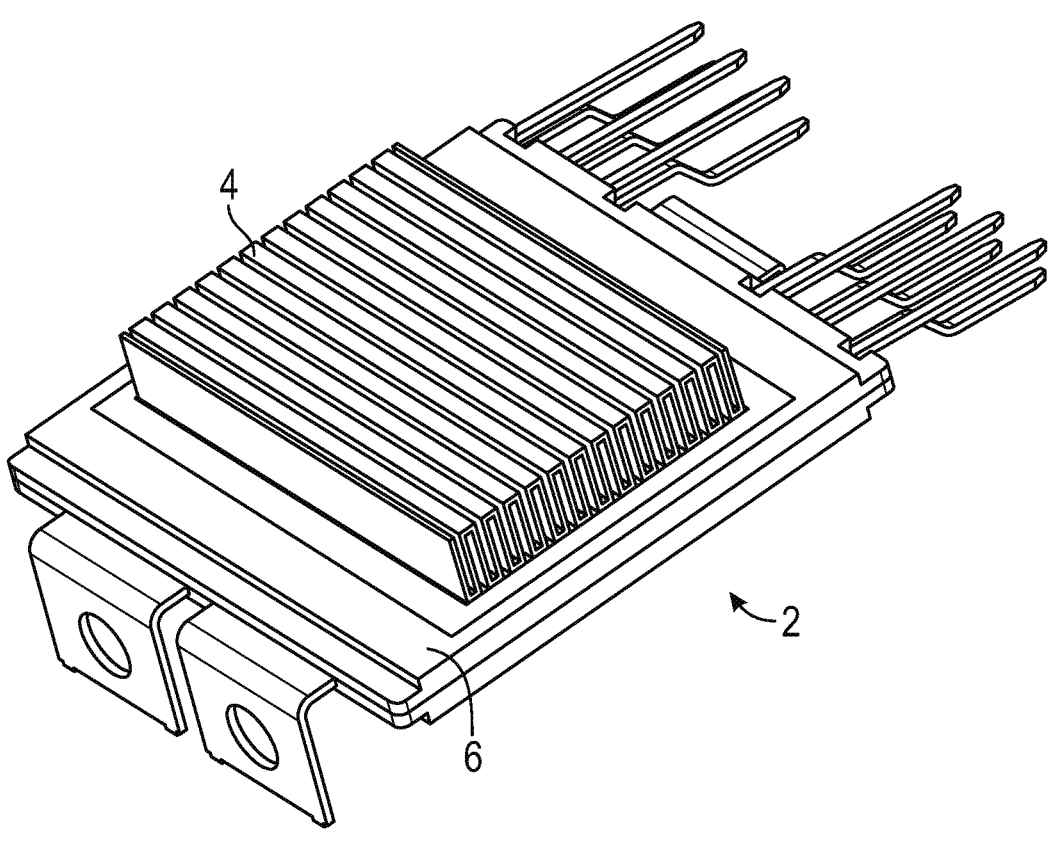
FIG. 1 is a perspective view of an implementation of a half bridge direct cooling module with single side cooling.
Figure 2:
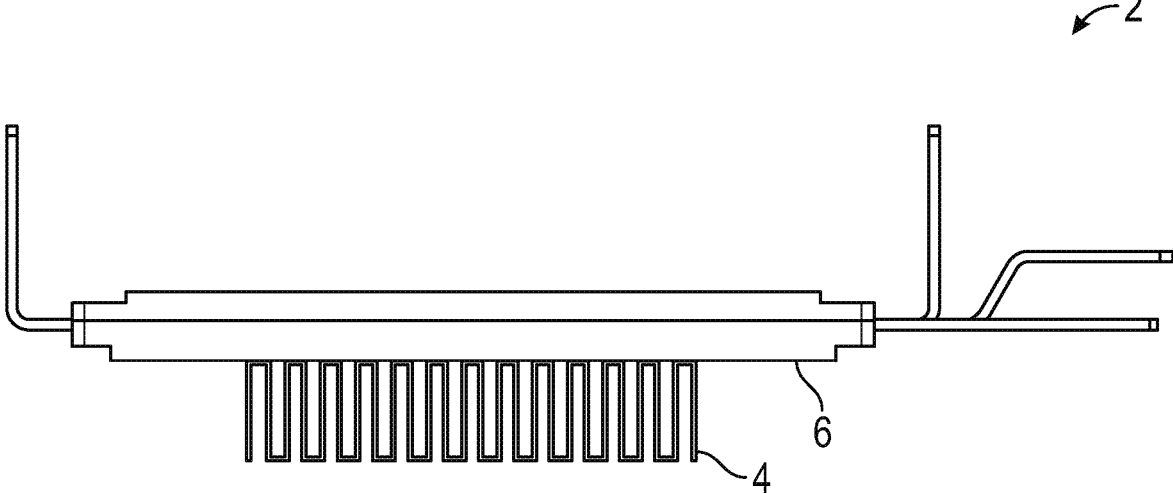
FIG. 2 is a side view of the implementation of the half bridge direct cooling module of FIG. 1.

Referring to FIG. 1, a perspective view of an implementation of a half bridge direct cooling module 2 is illustrated with single side cooling via a folded fin heat sink 4 coupled to a first largest planar surface 6 of the module 2. FIG. 2 illustrates a side view of the half bridge direct cooling module 2 showing the structure of the folded fin heat sink 4.

The half bridge direct cooling module 2 is electrically combined with another half bridge direct cooling module 2 to form a single switch that may be used with, by non-limiting example, a direct current (DC) motor or an alternating current motor (AC). Because the half bridge direct cooling modules are cooled on only one side, when included in a liquid cooling assembly, they are aligned side by side with their largest planar surfaces oriented in parallel to allow the folded fin heat sinks 4 an equal opportunity to contact the fluid flow. For assemblies that include three switches used in, by non-limiting example, a three phase motor driver, six half bridge direct cooling modules are included which results in the cooling assembly being six modules long and can result in a significant temperature rise down the length of the cooling assembly from the first module to the sixth module. This causes cooling of the sixth module to be less efficient than for the first module due to the cooling fluid temperature rise.

Figure 3:
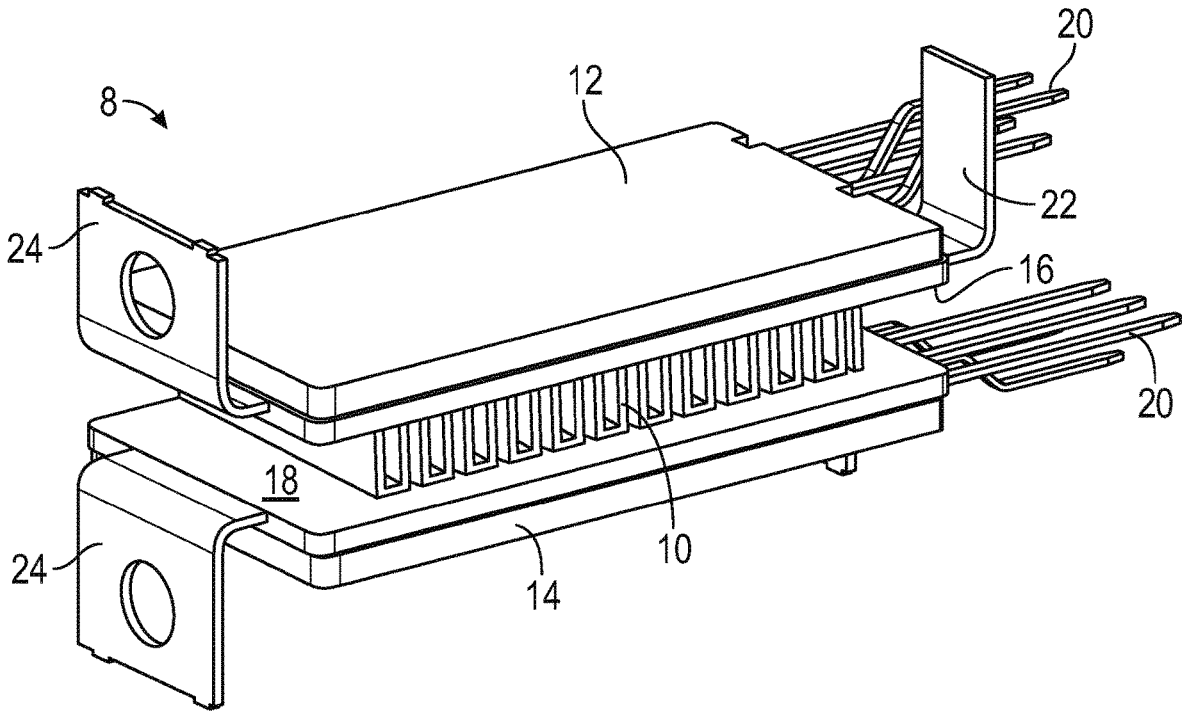
FIG. 3 is a perspective view of an implementation of a single switch direct cooling module (single switch module) with single side cooling.

Referring to FIG. 3, an implementation of a single switch direct cooling module (single switch module) 8 that is single side cooled using a folded fin heat sink 10 is illustrated. Here the single switch module 8 includes high side module 12 and low side module 14. The high side module 12 includes the high side half bridge circuitry of the switch and the low side module 14 includes the low side half bridge circuitry of the switch. While the semiconductor package implementations disclosed herein include semiconductor devices and related circuitry used in switches, the mechanical and thermal structures and principles disclosed herein can be applied with a wide variety of semiconductor device/circuit types including, by non-limiting example, rectifiers, inverters, boost converters, thyristors, lateral devices, metal oxide semiconductor field effect transistors (MOSFETs), insulated gate bipolar transistors (IGBTs), gallium nitride semiconductor devices, silicon carbide semiconductor devices, gallium arsenide semiconductor devices, or any other semiconductor device/circuit type where fluid cooling of a package using a heat sink is desired.

As illustrated in FIG. 3, the use of the single folded fin heat sink 10 to directly couple the high side module 12 and low side module 14 allows the perimeters of both modules to be substantially aligned over each other. Where, as in this implementation, the high side module 12 and the low side module 14 are half bridge modules that form a single circuit, this ability to overlap the perimeters of the modules can allow for reducing a total length of a cooling assembly that includes the single switch module. For example, where three single switch modules like those illustrated in FIG. 3 are included in a cooling assembly, the total length of the cooling assembly now only would need to be three modules long rather than six modules as with the half bridge direct cooling module illustrated in FIGS. 1 and 2. In the implementation illustrated in FIG. 3 and referring to the side view illustrated in FIG. 4, the coupling heat sink 10 (a single folded fin heat sink in this implementation) both mechanically and thermally couples the high side module 12 and the low side module 14 together at a first largest planar surface 16 of the high side module 12 and at a first largest planar surface 18 of the low side module 14. While the use of a folded fin heat sink design is illustrated in FIGS. 3-4 and throughout this document, this is only for convenience as many other heat sink designs could be used in various implementations, including, by non-limiting example, pin fin heat sinks, extruded heat sinks, bonded-fin heat sinks, skived heat sinks, or any other heat sink type capable of mechanically and thermally connecting the high side module 12 and low side module 14.

Figure 4:
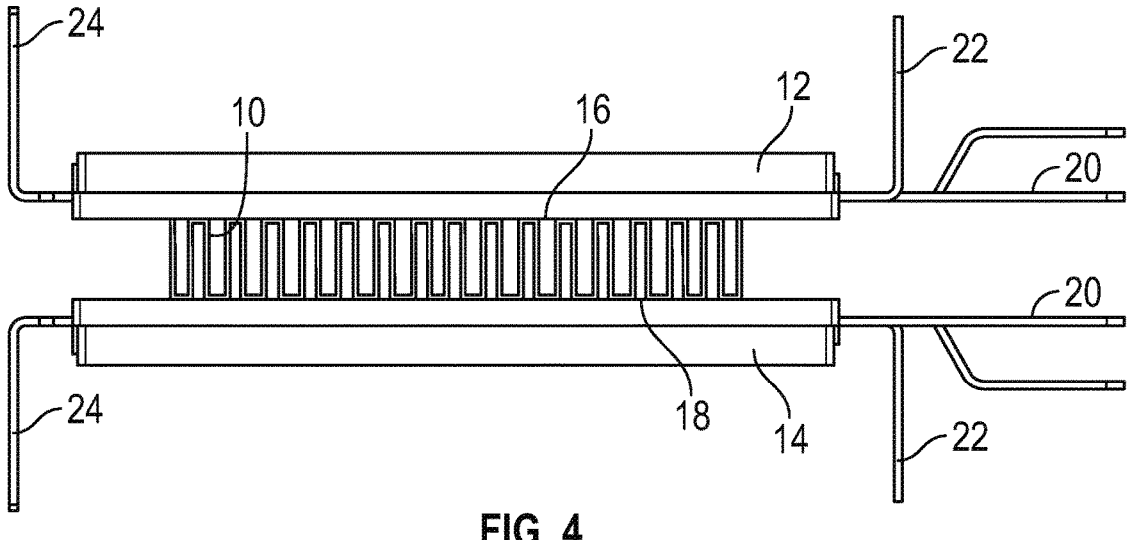
FIG. 4 is a side view of the single switch module implementation of FIG. 3.

As illustrated in FIGS. 3-4, various electrical connectors 20, 22, 24, extend from two ends of the high side module 12 and the low side module 14. In the various module implementations, the particular type, orientation, and point at which the electrical connectors extend from the modules depend on the particular semiconductor device/electrical circuit(s) included in the modules so a wide variety of electrical connector types can be employed in various implementations.

Figure 5:
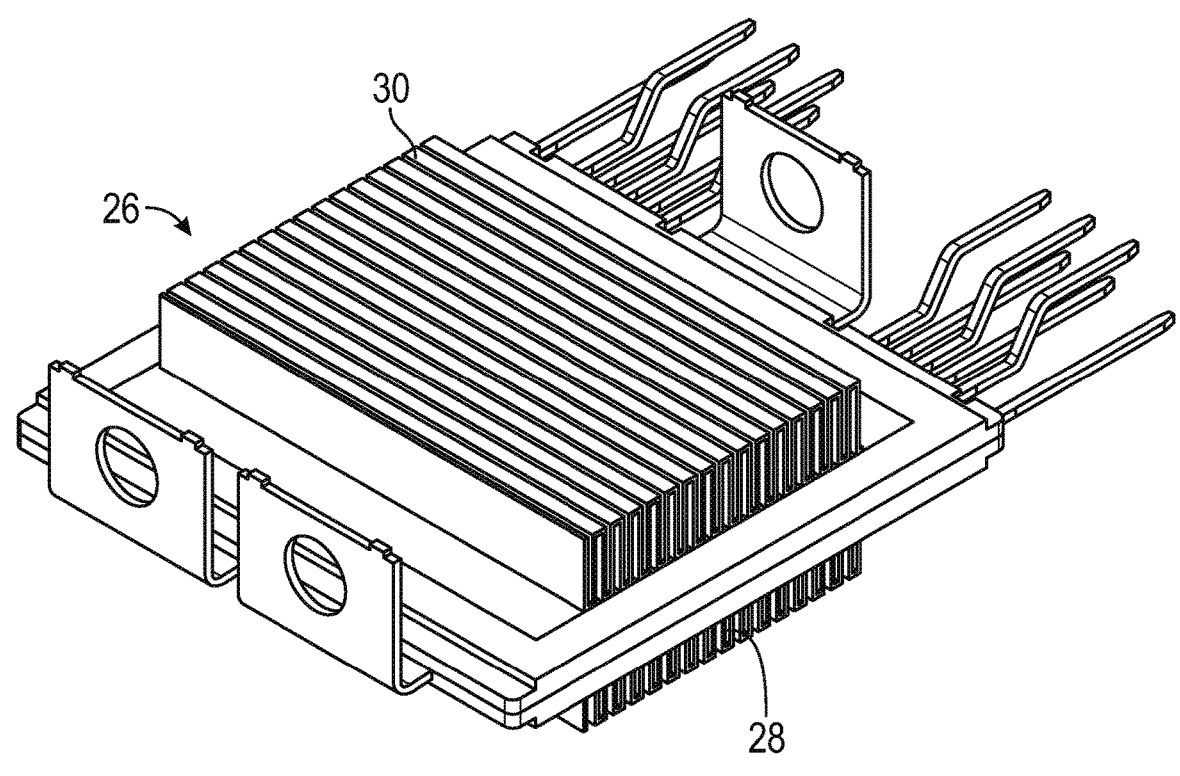
FIG. 5 is a perspective view of an implementation of a half bridge direct cooling module with dual side cooling.
Figure 6:
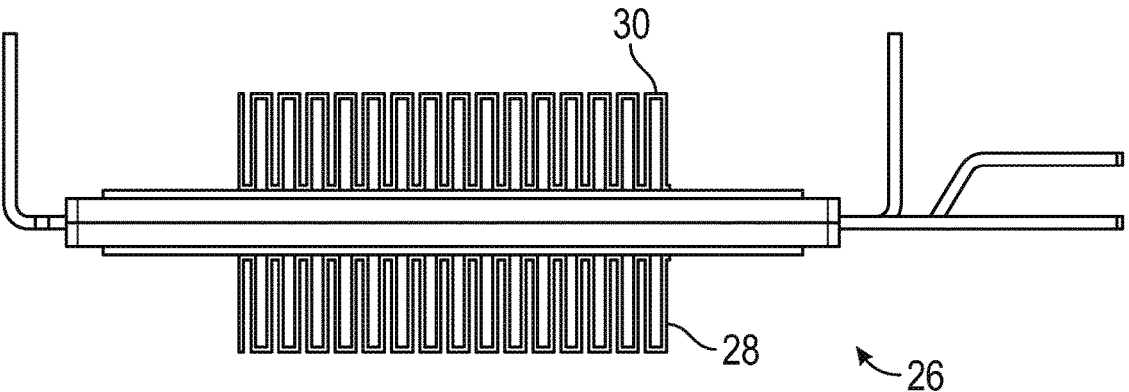
FIG. 6 is a side view of the implementation of the half bridge direct cooling module of FIG. 5.

Referring to FIG. 5, a perspective view of an implementation of a half bridge direct cooling module 26 that has two folded fin heat sinks 28, 30 is illustrated, each coupled to a largest planar surface of the module 26. FIG. 6 illustrates a side view of the implementation oof FIG. 5. As with the half bridge direct cooling module 2 illustrated in FIGS. 1 and 2, while the use of the two folded fin heat sinks 28, 30 helps with increasing heat transfer from the module, since the module is only half of the switch circuitry, the length of the cooling assembly will be about the same as when the modules of FIGS. 1-2 are used. Furthermore, the increased ability to transfer heat from the half bridge direct cooling module 26 due to the increased surface area of the two heat sinks may worsen rather than improve the issue of increasing coolant temperature along the length of the cooling assembly as the cooling fluid will experience enhanced heat transfer.

Figure 7:
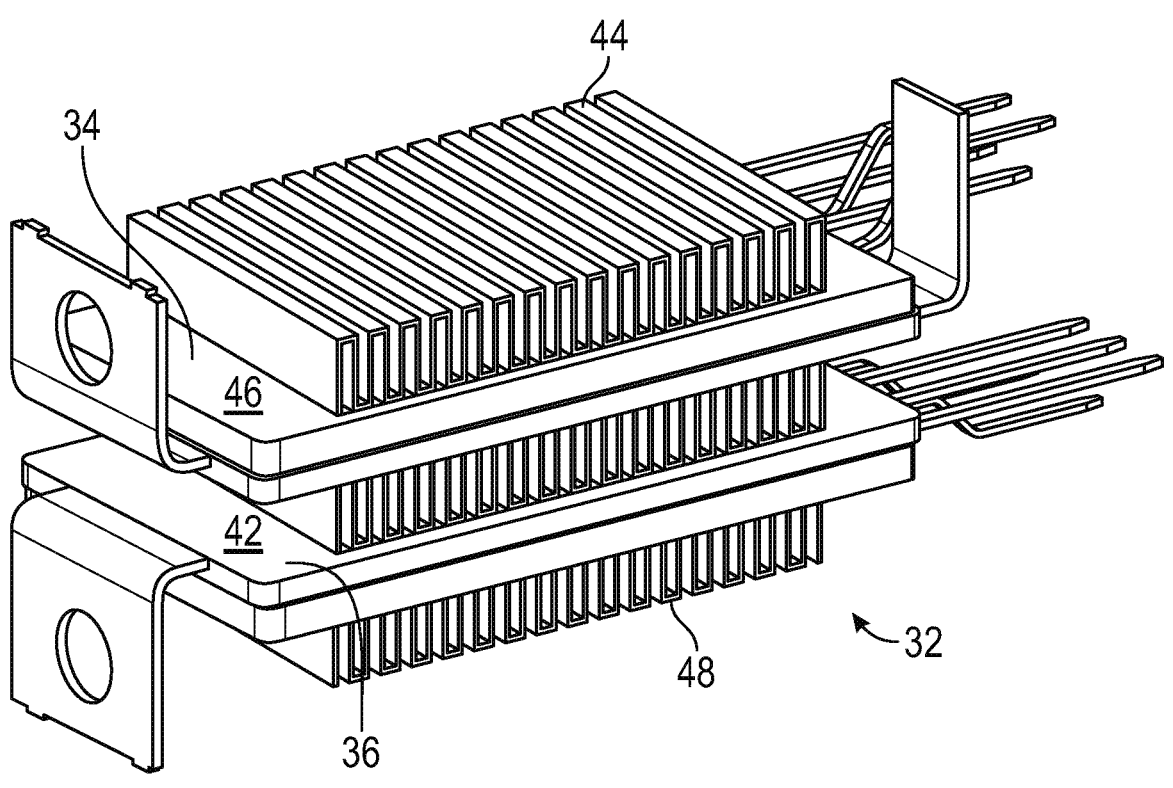
FIG. 7 is a perspective view of an implementation of a single switch direct cooling module (single switch module) with dual side cooling.
Figure 8:
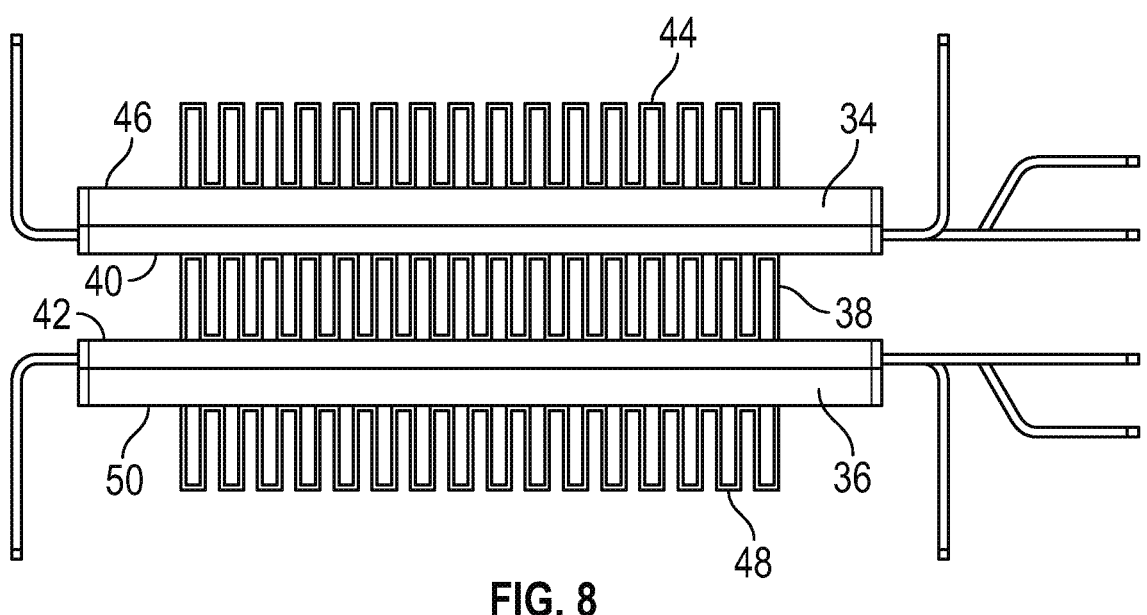
FIG. 8 is a side view of the implementation of the single switch module of FIG. 7.

Referring to FIG. 7, an implementation of a single switch module 32 is illustrated that incorporates dual side cooling. Like the single switch module implementation 8 of FIGS. 3-4, the module 32 includes a high side module 34 and a low side module 36 that are directly mechanically coupled through coupling heat sink 38. Coupling heat sink 38 also thermally couples the high side module 34 and the low side module 36 at a first largest planar surface 40 of the high side module 34 and a first largest planar surface 42 of the low side module 36. As illustrated in FIGS. 7 and 8, a high side heat sink 44 is coupled to second largest planar surface 46 of the high side module 34. A low side heat sink 48 is also coupled to a second largest planar surface 50 of the low side module 36. As previously discussed, the high side module 34 and low side module 36 together form a single switch circuit. However, any of the semiconductor device and circuit implementations disclosed in this document could be used in place of the high side module and low side module in various package implementations.

While all three of the coupling heat sink 38, the high side heat sink 44, and the low side heat sink 48 are illustrated to have the same structure (a folded fin design in the implementation illustrated in FIGS. 7-8), they could be different heat sink designs in various implementations. For example, the coupling heat sink 38 could have one pin structure while the high side heat sink 44 and low side heat sink 48 could use another pin structure. Alternatively, all three heat sinks could use different pin structures. Any of the heat sink types and pin structures disclosed in this document could be used for the coupling heat sink 38, the high side heat sink 44, or the low side heat sink 48.

The previously discussed module types are used in a cooling system where flowing coolant contacts the surfaces of the modules. As the flowing coolant in these systems often is electrically conductive (like water) and may contain corrosive ions or other chemicals, the semiconductor components of the modules are enclosed/encapsulated in mold compounds or other protective films. In immersion cooling systems, however, as the coolant is not electrically conductive and does not contain appreciable amounts of corrosives or other conductive materials, the need to encapsulate the modules may not be needed and may be avoided to increase heat transfer effects to the coolant. Accordingly, the various semiconductor die and other components remain exposed to the coolant.

Figure 9:
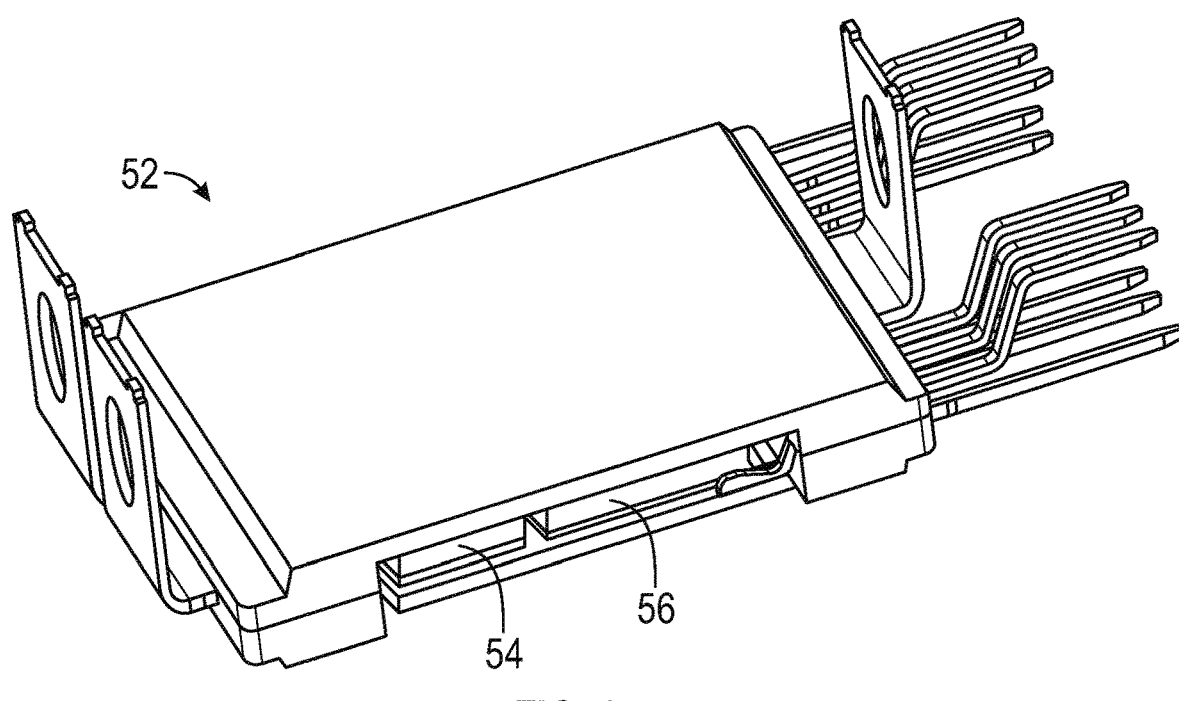
FIG. 9 is a perspective view of an implementation of a half bridge direct cooling module configured for immersion cooling.
Figure 11:
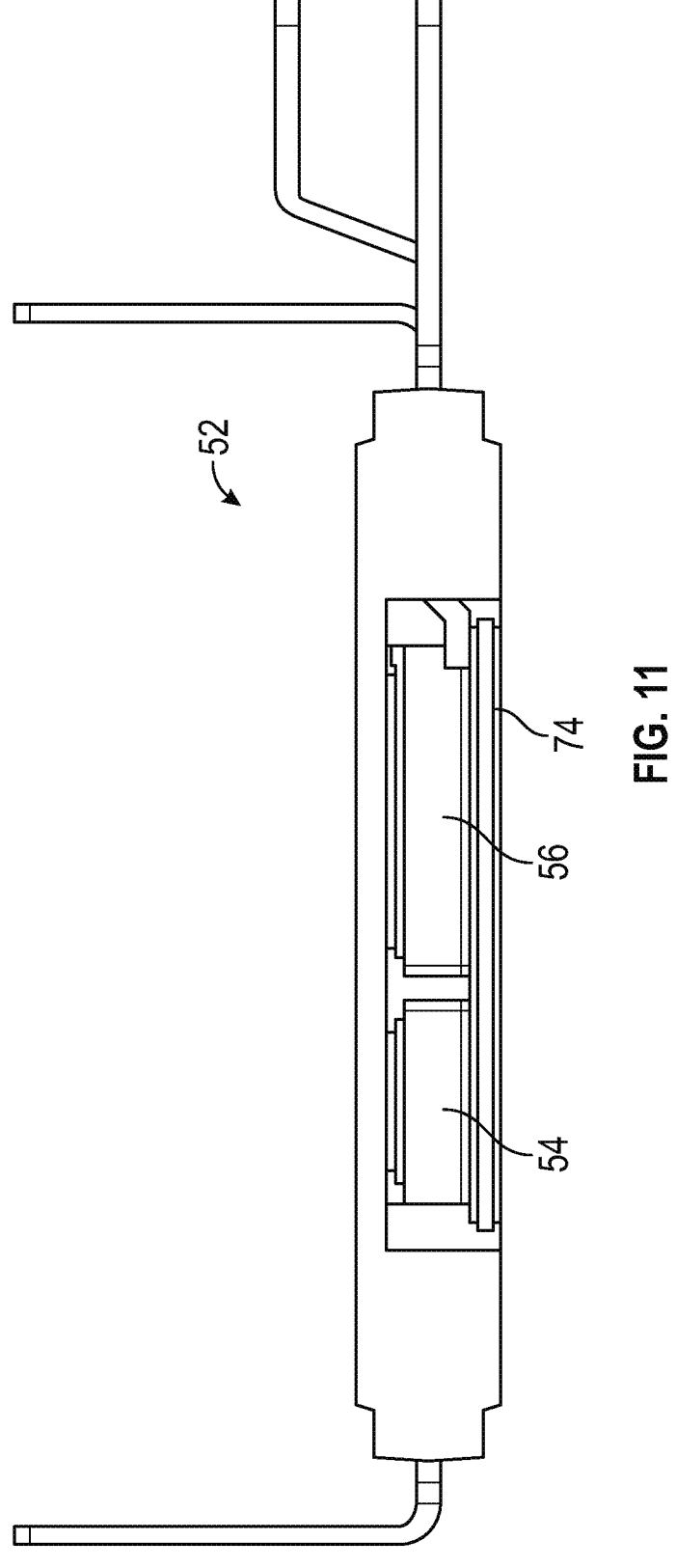
FIG. 11 is a side view of the half bridge direct cooling module implementation of FIG. 9.

FIG. 9 illustrates a half bridge direct cooling module 52 that does not include encapsulant and which shows various semiconductor die 54, 56 therein. This half bridge direct cooling module 52 will be placed into an immersion cooling assembly along with other similar modules. Referring to FIG. 11, a side view of the half bridge direct cooling module of FIG. 9 is illustrated in more detail showing the semiconductor die 54, 56 and heat transfer plate 74 coupled thereto. Like the cooling assembly for the previously discussed half bridge modules, in various implementations, the half bridge modules will be placed side by side down the length of the immersion cooling assembly, with the result that for an assembly that contains three switch circuits, the immersion cooling assembly will be six half bridge modules long.

Figure 10:
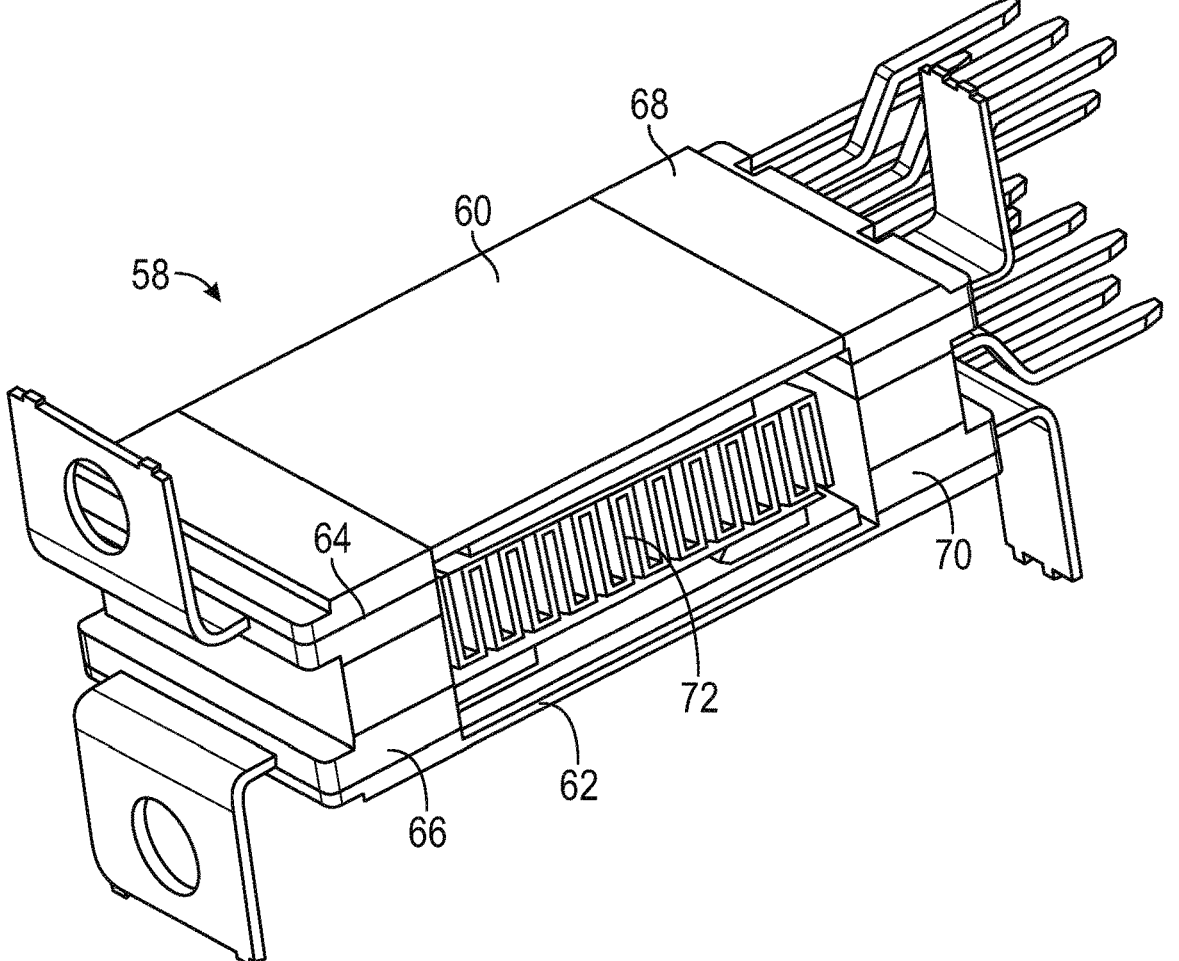
FIG. 10 is a perspective view of a single switch direct cooling module (single switch module) configured for single side immersion cooling.
Figure 12:
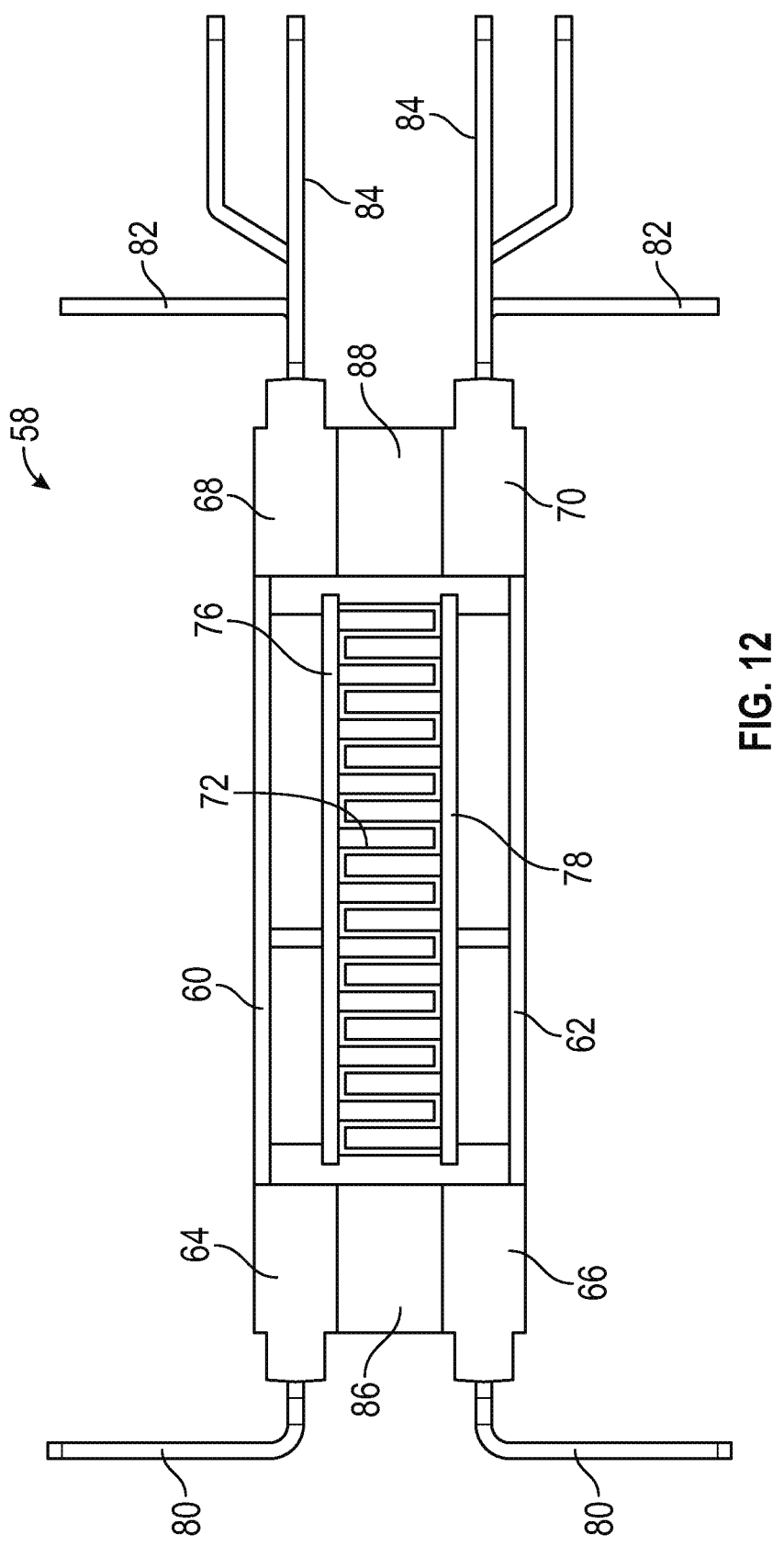
FIG. 12 is a side view of the single switch module of implementation FIG. 10.

Referring to FIG. 10, an implementation of a single switch module 58 is illustrated that is designed for use in an immersion cooling assembly. Here the high side module 60 and the low side module 62 are coupled together at first ends 64, 66 and at second ends 68, 70. In various implementations, they may be coupled together mechanically using, by non-limiting example, a spacer and fasteners, mold compound, clips, brackets, spacers and mold compound, or any other structure or system for mechanically coupling. Coupled between/to the high side module 60 and the low side module 62 is coupling heat sink 72. In this implementation, the coupling heat sink 72 may mechanically couple the high side module 60 and the low side module 62 together. In other implementations, the coupling heat sink 72 may work principally to thermally couple the high side module 60 and the low side module 62 together. As illustrated in FIG. 10, the coupling heat sink 72 is a folded fin heat exchanger, but in other implementations any other heat exchanger type/pin design disclosed herein may be employed. FIG. 12 is a side view of the single switch module 58 of FIG. 10 showing the coupling heat sink and how it is coupled with heat transfer plates 76, 78 of the high side module 60 and low side module 62, respectively. Similar to the previously discussed single switch modules, various electrical connectors 80, 82, 84 extend from first ends 64, 66, and second ends 68, 70 to allow the single switch module to be electrically coupled into the larger circuit of the system the switch circuit is controlling. FIG. 10 also illustrates how mold compound 86, 88 is used to couple the first ends 64, 66 and second ends 68, 70 together.

Figure 13:
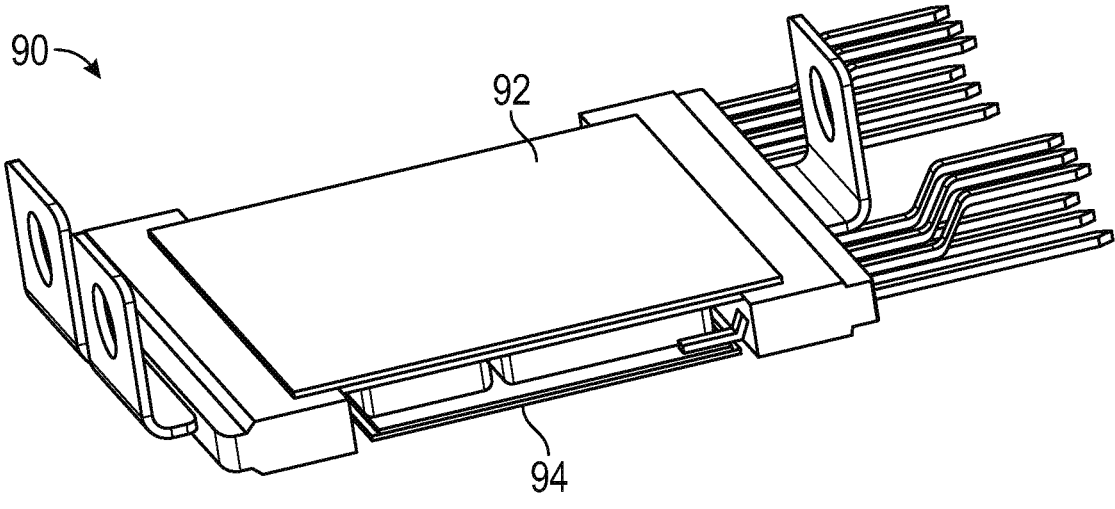
FIG. 13 is a perspective view of another implementation of a half bridge direct cooling module configured for immersion cooling.
Figure 15:
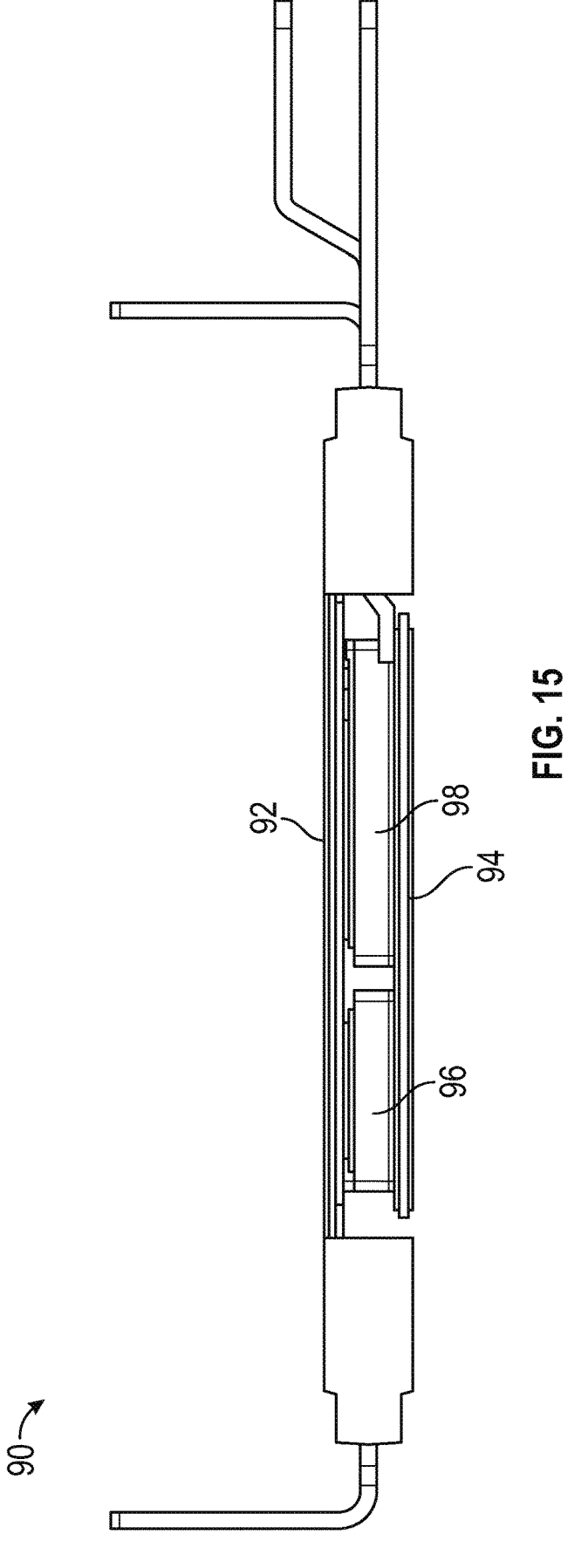
FIG. 15 is a side view of the half bridge direct cooling module implementation of FIG. 13.

Referring to FIG. 13, another implementation of a half bridge direct cooling module 90 designed for immersion cooling using dual cooling that includes an upper heat transfer plate/slug 92 is illustrated. The use of the upper heat transfer plate/slug 92 is used to facilitate heat transfer from the top and bottom side of the module and in some implementations, heat sinks like those disclosed herein may be attached to the upper heat transfer plate/slug 92 and a corresponding lower heat transfer plate/slug 94. FIG. 15 is a side view of the half bridge direct cooling module 90 of FIG. 13 showing the exposed semiconductor die 96, 98 and the upper heat transfer plate/slug 92 and lower heat transfer plate/slug 94.

Figure 14:
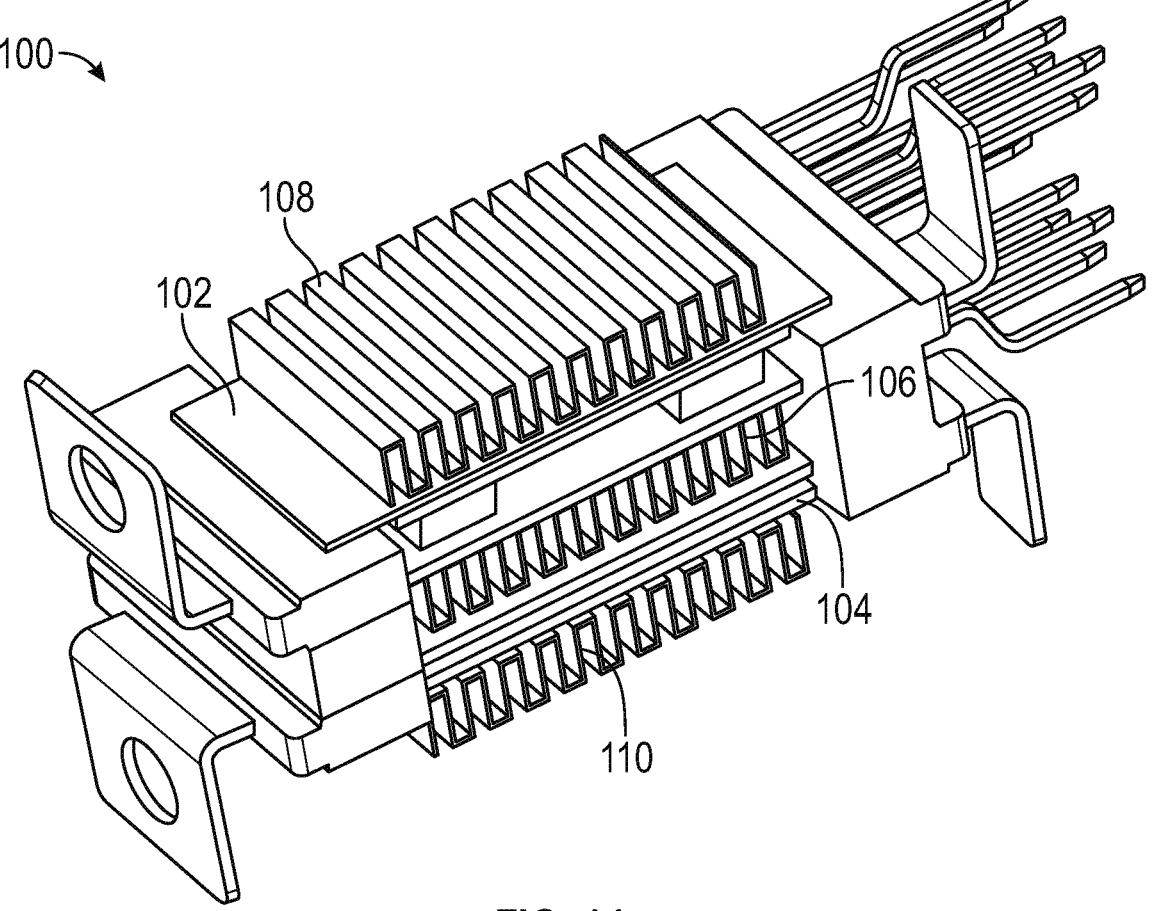
FIG. 14 is a perspective view of an implementation of a single switch direct cooling module (single switch module) configured for dual side immersion cooling.
Figure 16:
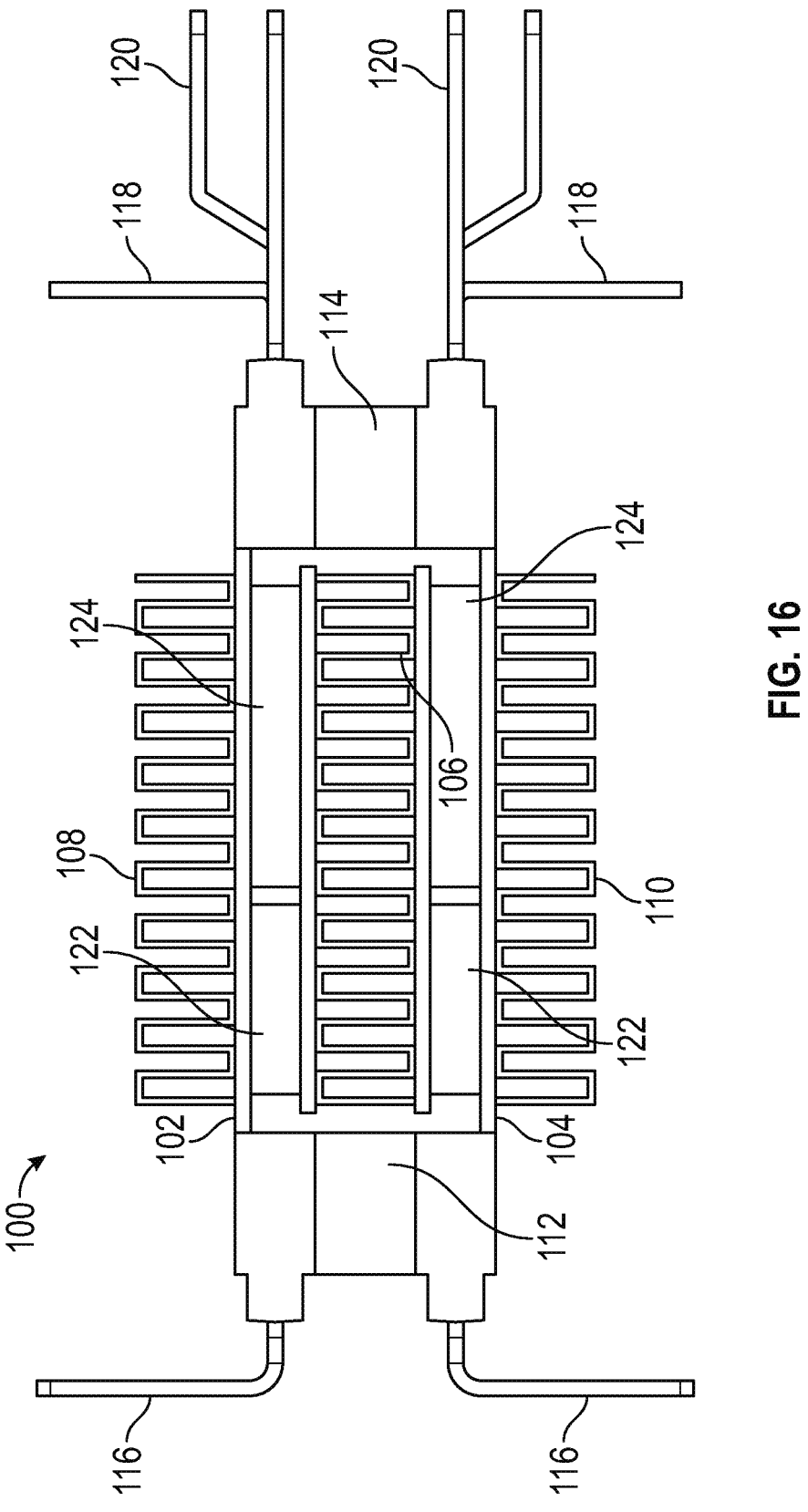
FIG. 16 is a side view of the single switch module implementation of FIG. 14.

Referring to FIG. 14, a perspective view of a single switch module 100 designed for use in an immersion cooling assembly is illustrated. As illustrated, the single switch module 100 includes high side module 102 and low side module 104 which are coupled through coupling heat sink 106 (best illustrated in the side view of FIG. 16). High side heat sink 108 is coupled to the high side module 102 and low side heat sink 110 is coupled to the low side module 104. Similar to the single switch module 58 of FIG. 10, the high side module 102 and low side module 104 implementations illustrated in FIGS. 14 and 16 are coupled together at their ends through an encapsulant/mold compound 112, 114. The single switch module 100 also includes electrical connectors 116, 118, 120 that extend from the ends of the high side module 102 and low side module 104. Similar to the single switch module 58 implementation illustrated in FIG. 10, because the perimeters of the high side module 102 and the low side module 104 substantially overlap/are arranged over each other, three single switch modules can be placed side by side in about half the length of the circuit equivalent number of half bridge modules (six). Because of this, the use of the single side modules 58, 100 can significantly reduce the length of the immersion cooling assemblies in which the modules are installed for the same switching capacity. Similar to the half bridge module 90, exposed semiconductor die 122, 124 are included in each of the high side module 102 and the low side module 104.

Figure 17:
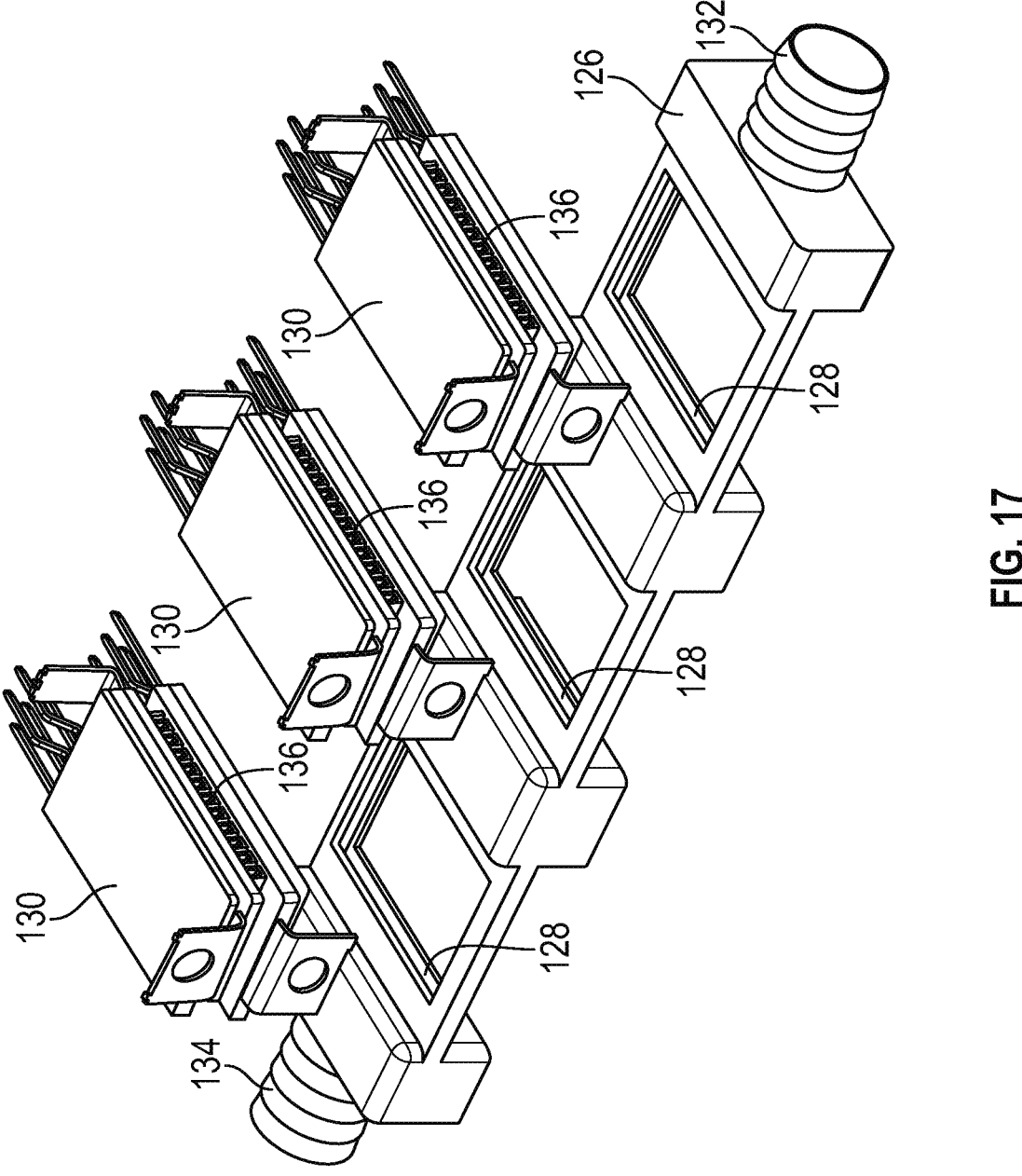
FIG. 17 is a perspective exploded view of three single switch module implementations with single side cooling prior to being coupled with a support frame implementation.
Figure 18:
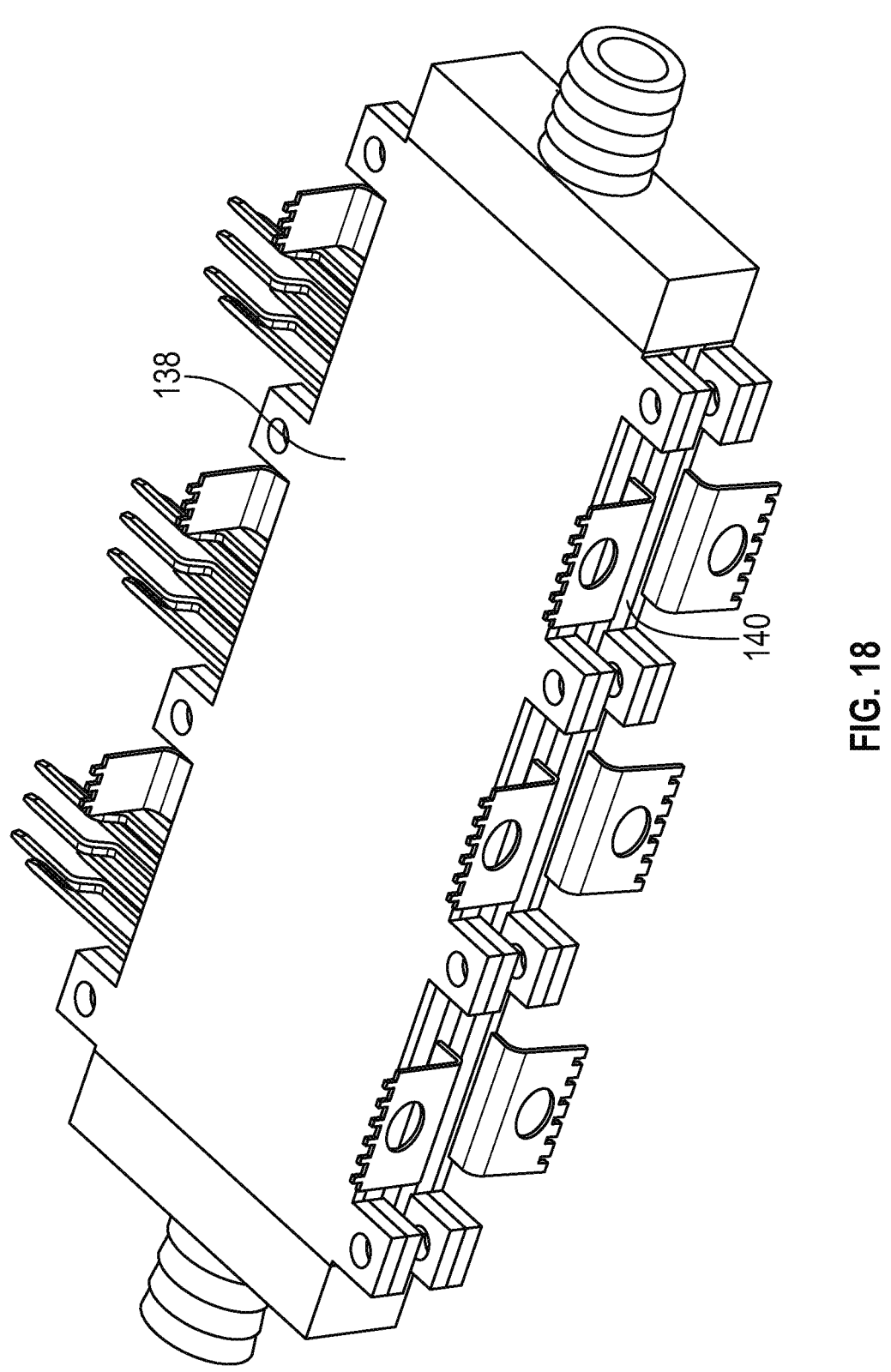
FIG. 18 is a perspective view of a cooling assembly implementation with upper and lower jackets coupled over three single switch module implementations with single side cooling and a support frame implementation.
Figure 19:
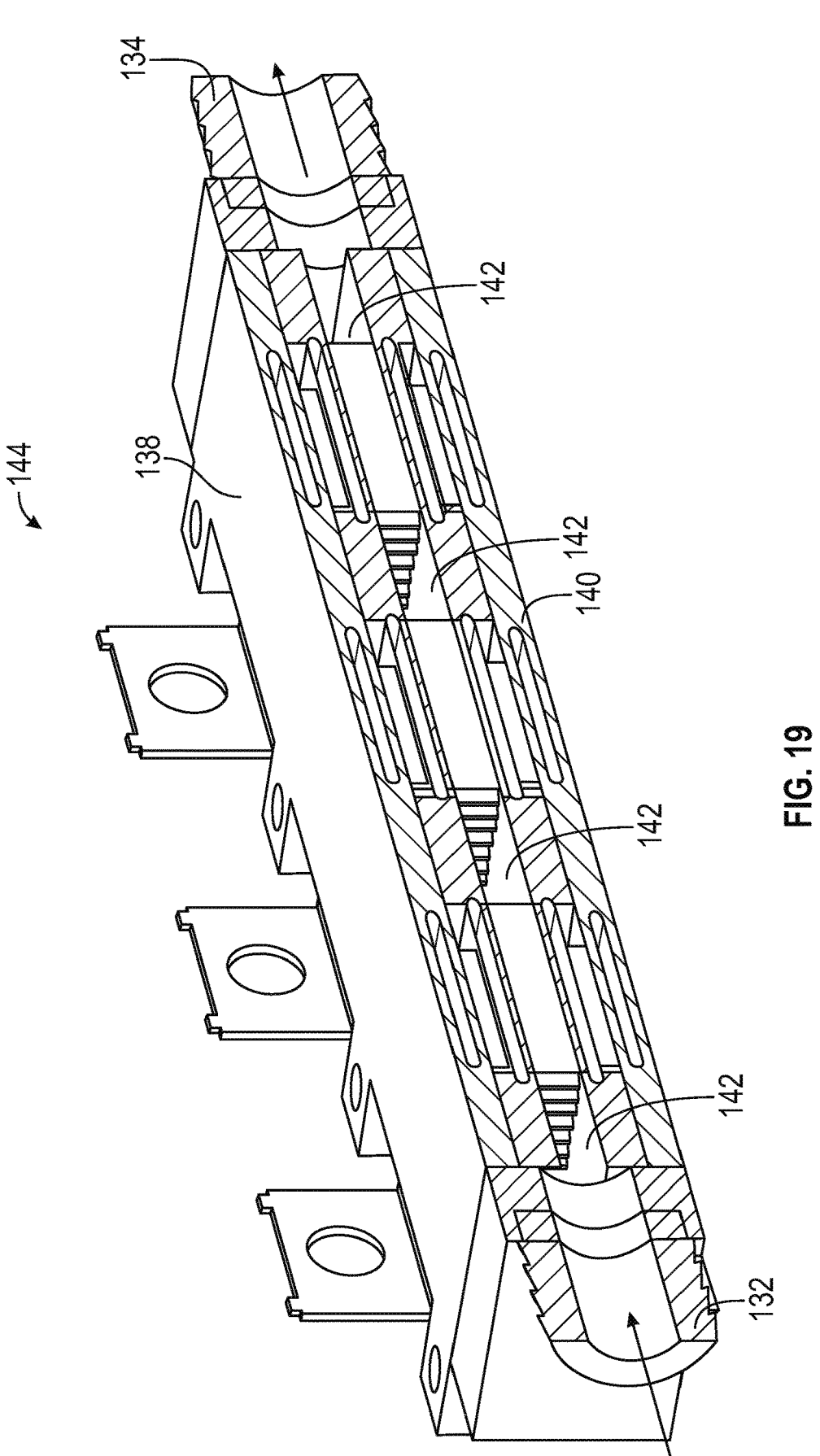
FIG. 19 is a perspective cross sectional view of the cooling assembly implementation of FIG. 18.

The various single switch modules disclosed in this document, both single side and dual side cooled, can be incorporated in various implementations of cooling assemblies, both immersion cooling and flow cooling. Referring to FIG. 17, an implementation of a support frame 126 is illustrated that includes openings 128 into which single side direct cooled single switch modules 130 like those disclosed herein can couple/attach. The support frame 126 contains a fluid inlet port 132 and fluid outlet port 134 through which a cooling fluid enters and is directed through the coupling heat sinks 136 of the single side direct cooled single switch module 130. To retain and direct the fluid through the coupling heat sinks 136 and referring to FIG. 18, an upper jacket 138 and lower jacket 140 are coupled over the single switch modules 130, forming a seal around the modules and the flow of the cooling fluid. FIG. 19 shows a cross section of the cooling assembly of FIG. 18 showing the direction of the cooling fluid flow from the fluid inlet port 132 to the fluid outlet port 134 and the channel 142 in which the fluid flows between the upper jacket 138 and lower jacket 140. In various implementations, the upper jacket 138 and lower jacket 140 can provide some additional thermal cooling for the single switch modules 130.

Figure 25:
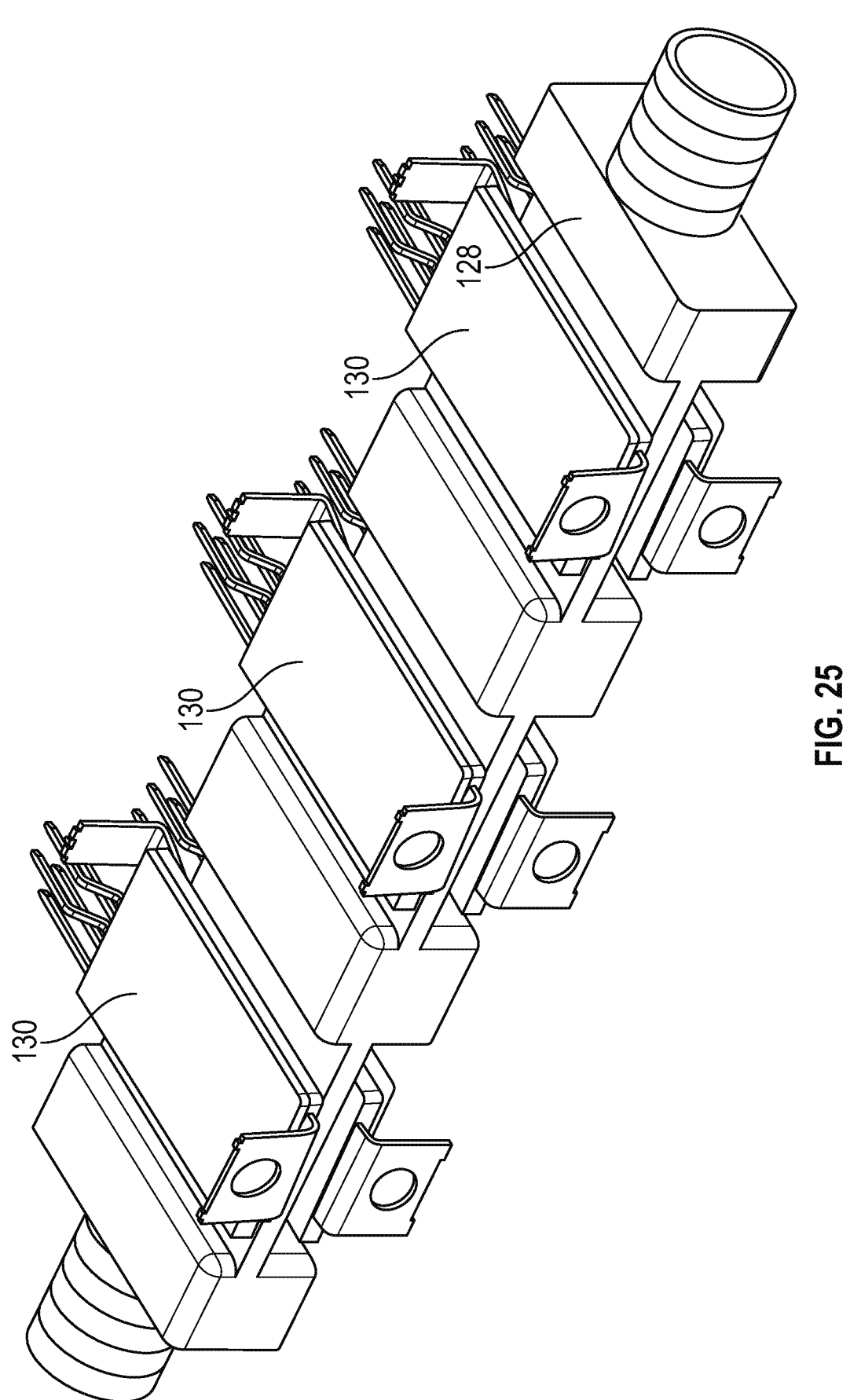
FIG. 25 is a perspective assembled view of an alternative cooling assembly using three single switch module implementations with single side cooling.

While the support frame 126 is illustrated in use with an upper jacket 138 and lower jacket 140 that couple over the support frame and the single switch modules 130, in other implementations, as illustrated in FIG. 25 with reference to FIG. 17, the jackets may not be used, and the system instead relies on a seal between the single switch modules 130 and the openings 128 of the support frame 126 to retain the cooling fluid as it flows from the fluid inlet port 132 and fluid outlet port 134. In such an implementation, the cooling of the cooling assembly takes place using almost entirely cooling fluid itself. However, the weight of the cooling assembly can be reduced by not including the jackets.

Figure 20:
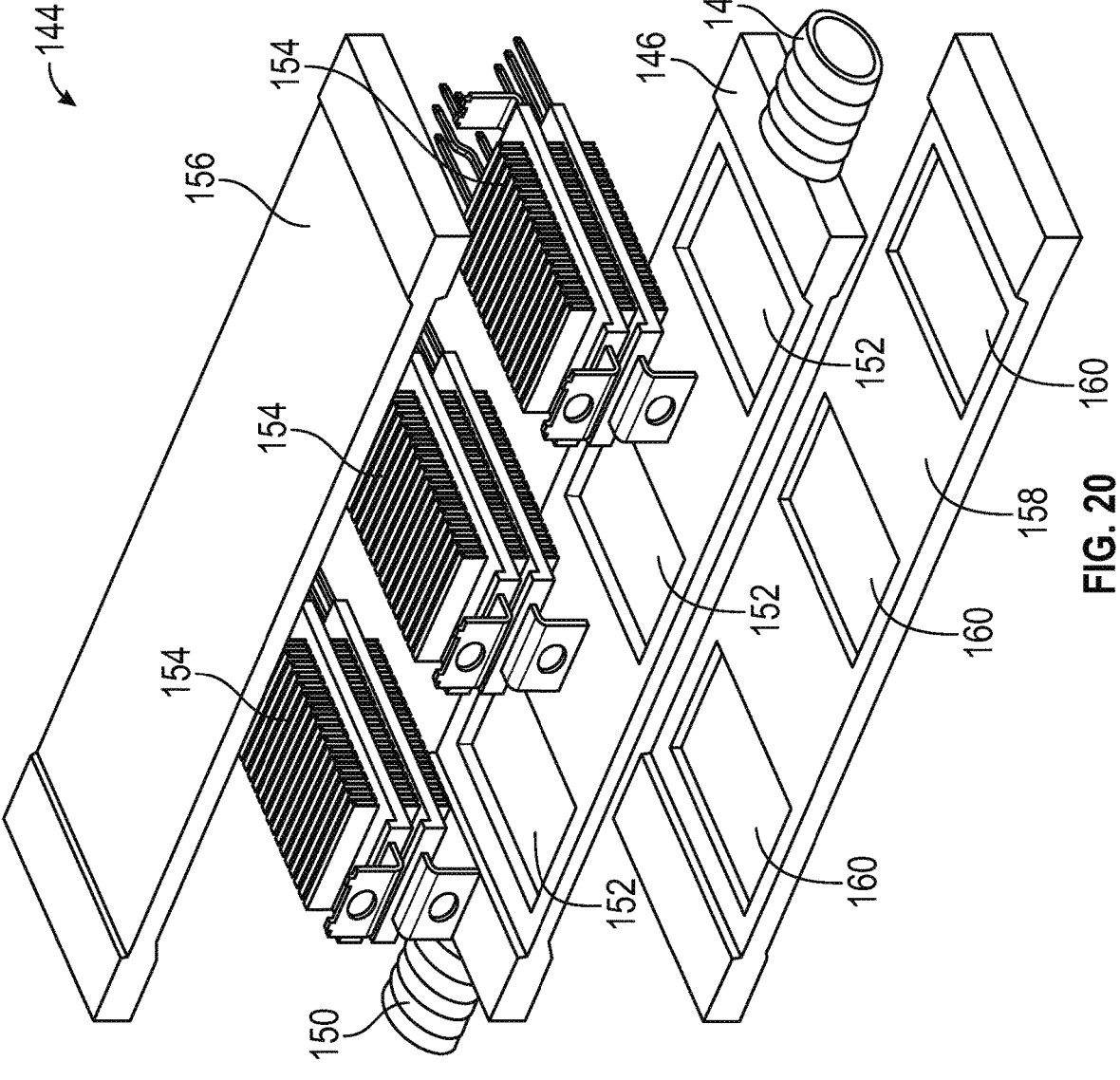
FIG. 20 is a perspective exploded view of a cooling assembly implementation that includes three single switch module implementations with dual side cooling showing upper and lower jacket implementations and a support frame implementation.
Figure 21:
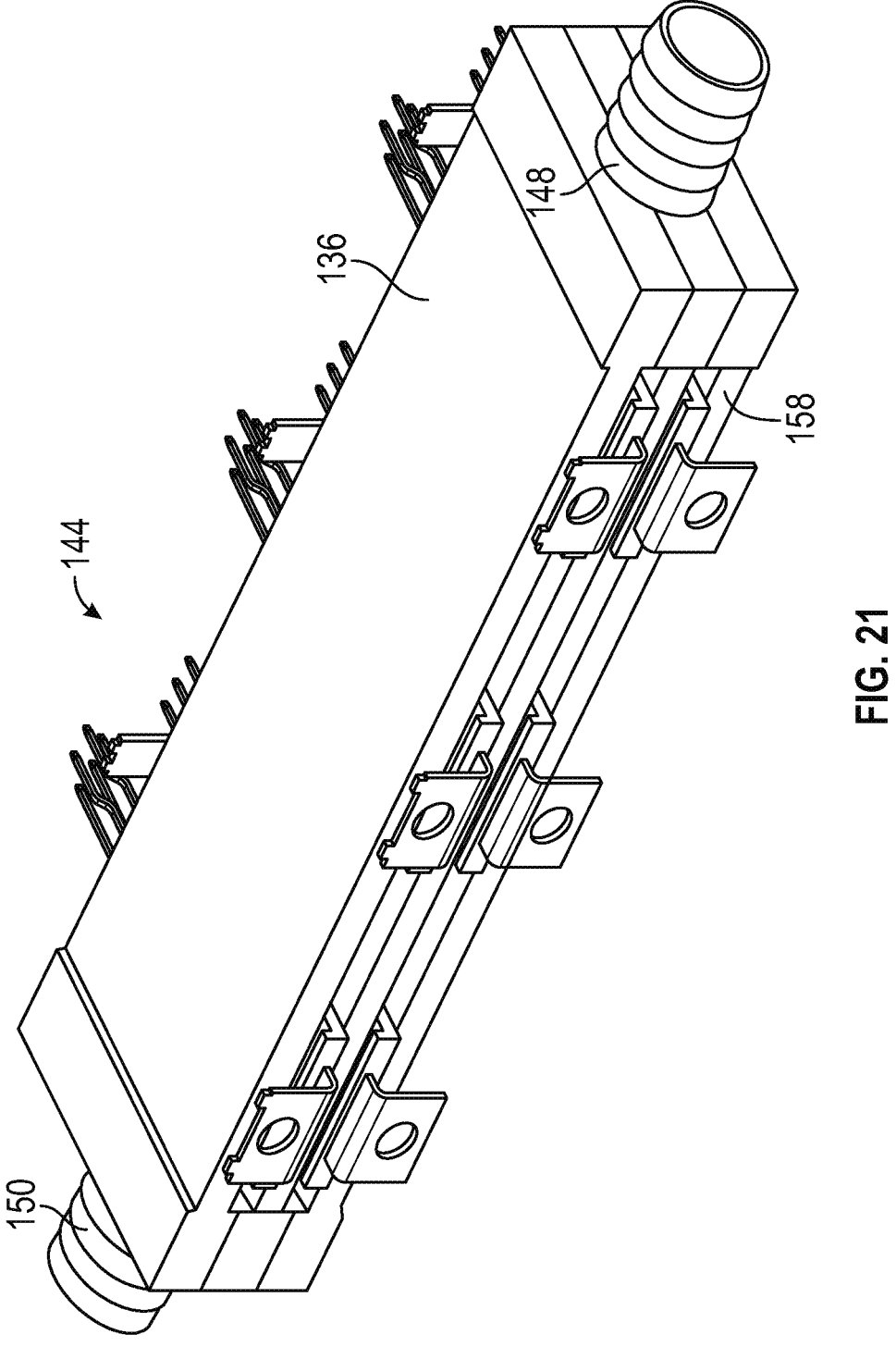
FIG. 21 is a perspective assembled view of the cooling assembly implementation of FIG. 20.

For the dual side cooled single switch modules, similar structures can be employed, but the use of the jackets is needed to form the flow passages around the high side and low side heat sinks. Referring to FIG. 20, a perspective exploded view of a cooling assembly 144 is illustrated that includes a support frame 146 that includes a fluid inlet port 148 and fluid outlet port 150. The support frame 146 includes openings 152 into which dual side cooled single switch modules 154 are coupled over which upper jacket 156 and lower jacket 158 are coupled. As illustrated, in this implementation, depressions 160 are provided in the upper jacket 156 and lower jacket 158 that accommodate the dimensions of the high side heat sinks and low side heat sinks of the single switch modules 154 and provide fluid pathways for the cooling fluid to contact the high side and low side heat sinks. Referring to FIG. 21, the assembled cooling assembly of FIG. 20 is illustrated showing the overlapping relation between the upper jacket 156 and lower jacket 158 and the fluid inlet port 148 and fluid outlet port 150 which allows fluid to flow into the depressions in the jackets.

Figure 22:
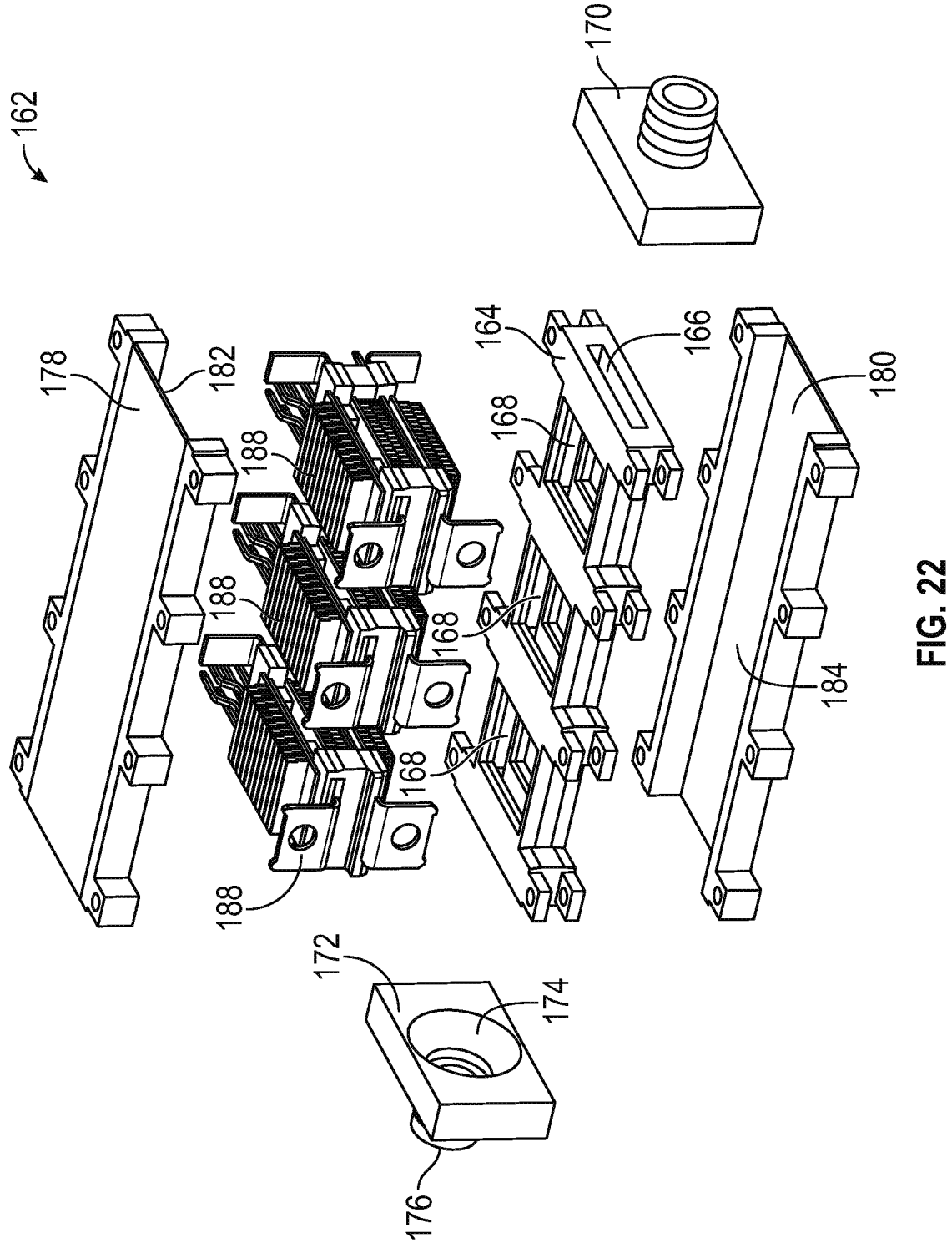
FIG. 22 is a perspective exploded view of a cooling assembly implementation that includes three single switch module implementations with dual side cooling along with a frame implementation and upper and lower jacket implementations with inlet and outlet portions.
Figure 23:
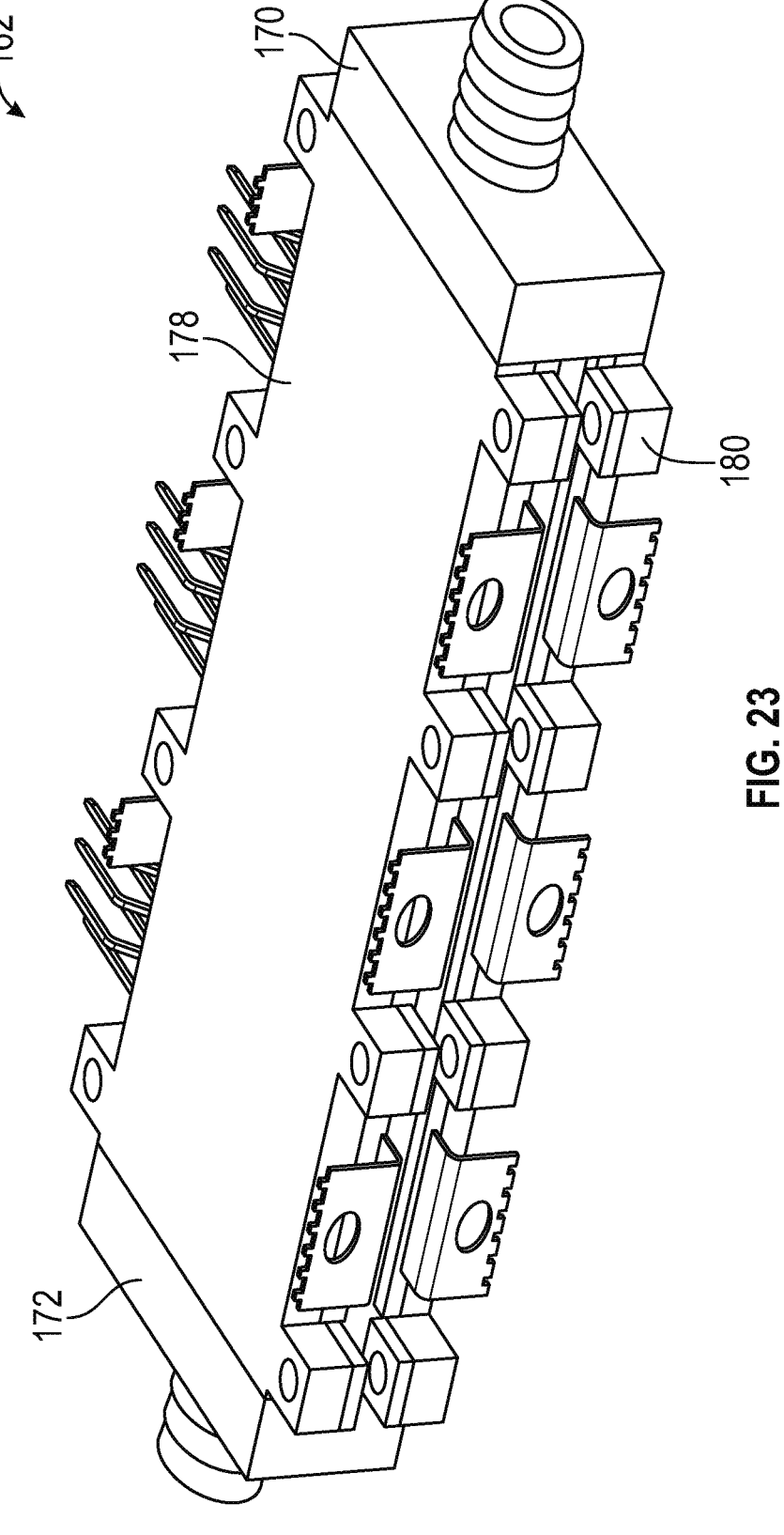
FIG. 23 is a perspective assembled view of the cooling assembly implementation of FIG. 22.

Referring to FIG. 22, another implementation of a cooling assembly 162 is illustrated in an exploded view. As illustrated, a support frame 164 is included that shows flow channels 166 that direct coolant to openings 168 therethrough. The design of the support frame 164 is thicker than the frame 146 of FIG. 20 allowing the cooling water to flow through the frame 164 rather than over the frame material as in the frame 146. Because of the greater thickness of the frame 164, a separate inlet port 170 and outlet port 172 are coupled to the frame 164. As illustrated in the perspective view of the outlet portion 172, the inside opening 174 is flared larger than the outside opening 176 (and correspondingly in the inlet portion though not illustrated in FIG. 22). The upper jacket 178 and lower jacket 180 each include channels 182, 184 therein. FIG. 23 is a perspective assembled view of the cooling assembly 162 showing how the thickness of the upper jacket 178 and lower jacket 180 are set to allow them to sit flush with the inlet port 170 and outlet port 172.

Figure 24:
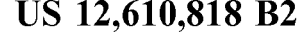
FIG. 24 is a perspective cross sectional view of the cooling assembly of FIG. 23.

Referring to the cross sectional view in FIG. 24, the effect of the flared inside openings 174 and 186 is to allow cooling fluid to flow through the openings 166 in the support frame 164 and upwardly and downwardly into the channels in the upper jacket 178 and lower jacket 180. This permits cooling fluid to flow across the high side heat sinks 190 and low side sinks 192 as well as the coupling heat sinks 194 of the dual side cooled single switch modules 188.

Any of the cooling assemblies disclosed in this document could be used with single switch modules designed for fluid flow cooling or immersion cooling. In various implementations of immersion cooled cooling assemblies, the immersion fluid may be cycled through the cooling assembly similar to the fluid flow cooled implementations. The chief difference between the two versions is the nature of the cooling fluid and whether the semiconductor die are covered with a protective material to prevent direct contact with the cooling fluid. The dual side cooled single switch modules 188 of cooling assembly 162 are designed for immersion cooling. Accordingly, the cooling assembly 162 is designed for immersion cooling whether single phase or two phase cooling. Where two phase immersion cooling systems are employed, the two phase transition may take place throughout the cooling assembly 162. In other implementations, the phase transition may take place in a flash tank or other vessel coupled with the outlet of the of cooling assembly. Any of a wide variety of immersion cooling system components may be employed with the various cooling assemblies disclosed herein. Similarly, any of a wide variety of flow cooling system components (heat exchangers, etc.) may be employed with the various cooling assemblies used for flow cooling.

As illustrated in the cross sections of the implementation of the cooling assembly 162 of FIG. 24 and the implementation of the cooling assembly 144 of FIG. 19, during operation a single cooling fluid contacts the coupling heat sink, high side heat sink, and low side heat sink of each module. This is because each cooling assembly and dual side cooled single switch module work together to direct flow of the same coolant (immersion or otherwise) over the heat sinks of each module. In this way, the need to multiple flow paths through the same module or the use of multiple coolant streams is avoided.

In places where the description above refers to particular implementations of single switch direct cooling assemblies and related methods and implementing components, sub-components, methods and sub-methods, it should be readily apparent that a number of modifications may be made without departing from the spirit thereof and that these implementations, implementing components, sub-components, methods and sub-methods may be applied to other single switch direct cooling assemblies and related methods.

What is claimed is:

1. A cooling assembly comprising:
  at least two single switch modules coupled into corresponding openings in a support frame;
  an upper jacket coupled to the support frame;
  a lower jacket coupled to the support frame;
  a coolant inlet coupled with the support frame; and
  a coolant outlet coupled with the support frame;
  wherein each of the at least two single switch modules comprises a high side module directly mechanically coupled over a low side module through a coupling heat sink at a first largest planar surface of the high side module and at a first largest planar surface of the low side module.

2. The assembly of claim 1, wherein the support frame comprises at least two flow pathways therein configured to direct cooling fluid to the coupling heat sink of each of the at least two single switch modules.

3. The assembly of claim 1, wherein the lower jacket and the upper jacket are coupled over the at least two single switch modules.

4. The assembly of claim 1, wherein the assembly is an immersion cooling module.

5. The assembly of claim 1, wherein the at least two single switch modules are configured to be single side cooled by a coolant passing from the coolant inlet to the coolant outlet.

6. The assembly of claim 1, wherein the at least two single switch modules are configured to be dual side cooled by a coolant passing from the coolant inlet to the coolant outlet.

7. The assembly of claim 1, wherein the high side module and the low side module are thermally coupled only through the coupling heat sink.

8. The assembly of claim 1, further comprising:
  a high side heat sink coupled at a second largest planar surface of the high side module; and
  a low side heat sink coupled at a second largest planar surface of the low side module;
  wherein a single cooling fluid contacts the coupling heat sink, the high side heat sink, and the low side heat sink.

* * * * *